US011363716B2

(12) United States Patent
Higashide et al.

(10) Patent No.: US 11,363,716 B2
(45) Date of Patent: Jun. 14, 2022

(54) CONTROL DEVICE AND MOTOR DEVICE

(71) Applicant: JTEKT CORPORATION, Osaka (JP)

(72) Inventors: Tomohiro Higashide, Toba (JP);
Takaya Tanikawa, Toyohashi (JP);
Naotake Kanda, Okazaki (JP)

(73) Assignee: JTEKT CORPORATION, Osaka (JP)

( * ) Notice: Subject to any disclaimer, the term of this patent is extended or adjusted under 35 U.S.C. 154(b) by 296 days.

(21) Appl. No.: 16/671,262

(22) Filed: Nov. 1, 2019

(65) Prior Publication Data
US 2020/0146148 A1 May 7, 2020

(30) Foreign Application Priority Data

Nov. 6, 2018 (JP) .............................. JP2018-208782

(51) Int. Cl.
| *H05K 7/00* | (2006.01) |
| *H05K 1/14* | (2006.01) |
| *H05K 5/00* | (2006.01) |
| *H05K 7/14* | (2006.01) |

(52) U.S. Cl.
CPC ............. *H05K 1/141* (2013.01); *H05K 5/006* (2013.01); *H05K 7/1461* (2013.01)

(58) Field of Classification Search
CPC ....... H05K 1/141; H05K 5/006; H05K 7/1461
USPC ....................................................... 361/760
See application file for complete search history.

(56) References Cited

U.S. PATENT DOCUMENTS

| 10,668,944 | B2 * | 6/2020 | Fujimoto | ............... H02K 11/33 |
| 2002/0150478 | A1 * | 10/2002 | Aoki | ..................... B60N 2/5635 |
| | | | | 417/44.1 |
| 2006/0121774 | A1 * | 6/2006 | Ebert | ................. H01R 13/5812 |
| | | | | 439/445 |
| 2009/0086437 | A1 * | 4/2009 | Tsuyuno | ............ H05K 7/20454 |
| | | | | 361/709 |
| 2013/0257193 | A1 | 10/2013 | Toda et al. | |
| 2016/0036288 | A1 * | 2/2016 | Yamasaki | .............. H02K 5/225 |
| | | | | 180/446 |

FOREIGN PATENT DOCUMENTS

| JP | 2012-060805 A | 3/2012 |
| JP | 2013-232511 A | 11/2013 |

(Continued)

OTHER PUBLICATIONS

Apr. 30, 2021 Office Action issued in European Patent Application No. 19207359.1.

(Continued)

*Primary Examiner* — Andargie M Aychillhum
(74) *Attorney, Agent, or Firm* — Oliff PLC

(57) ABSTRACT

Provided is a control device and a motor device that can effectively suppress influence of vibration of a specific electronic component. A coil that is the specific electronic component is mounted on a circuit board. A connector portion has a base portion extending in a thickness direction of the circuit board and an extended portion extending from the base portion in a direction in which the circuit board extends. The extended portion of the connector portion has an annular portion, a support portion, and a pedestal portion. The pedestal portion serves as a portion to which the coil is bonded and fixed. With an adhesive applied to the pedestal portion, the pedestal portion bonds and fixes the coil thereto.

8 Claims, 6 Drawing Sheets

(56) References Cited

FOREIGN PATENT DOCUMENTS

| JP | 2018-088813 A | 6/2018 |
| WO | 2017/158966 A1 | 9/2017 |
| WO | 2018/197473 A1 | 11/2018 |

OTHER PUBLICATIONS

Mar. 20, 2020 Search Report issued in European Patent Application No. 19207359.1.

* cited by examiner

CONTROL DEVICE AND MOTOR DEVICE

INCORPORATION BY REFERENCE

The disclosure of Japanese Patent Application No. 2018-208782 filed on Nov. 6, 2018 including the specification, drawings and abstract is incorporated herein by reference in its entirety.

BACKGROUND OF THE INVENTION

1. Field of the Invention

The invention relates to a control device and a motor device.

2. Description of Related Art

As described in Japanese Unexamined Patent Application Publication No. 2018-88813 (JP 2018-88813 A), there is known a motor device in which a motor and a circuit board, which is composed of circuits for controlling drive of the motor, are integrated. In such a motor device, a connector portion is provided on the circuit board to connect the motor device to an external wiring. A plurality of electronic components is mounted on the circuit board.

When a road surface reaction force or the like acts on a vehicle, the electronic components may vibrate starting from a portion electrically connected to the circuit board. One method of suppressing vibration of the electronic components is to bond and fix a surface of the circuit board and the electronic components to each other. However, when the surface of the circuit board and the electronic components are bonded to each other, a vibration starting point that is a starting point of the vibration of the electronic components and a portion of the electronic components to be bonded to the circuit board are disposed close to each other. Thus, an effect of suppressing the vibration of the electronic components is small. Hence, there has been a need for a method of effectively suppressing an influence of the vibration of the electronic components.

SUMMARY OF THE INVENTION

An object of the invention is to provide a control device and a motor device that can effectively suppress the influence of the vibration of a specific electronic component.

A control device according to a first aspect of the invention includes a plurality of electronic components, a circuit board on which the electronic components are mounted, and a connector portion provided on the circuit board and configured to exchange information with an external device. The electronic components include a specific electronic component disposed adjacent to the connector portion. The connector portion has a base portion extending in a thickness direction of the circuit board and an extended portion extending from the base portion in a direction in which the circuit board extends. The extended portion has a pedestal portion serving as an adhesive fixing destination for the specific electronic component and configured to bond and fix the specific electronic component to the pedestal portion.

With the configuration described above, the pedestal portion to which the specific electronic component is bonded and fixed is provided in the extended portion extending from the base portion in the direction in which the circuit board extends. Thus, the position at which the specific electronic component and the pedestal portion are bonded and fixed to each other can be positioned further away from the circuit board than the position at which the specific electronic component and the circuit board are bonded and fixed to each other. Hence, the portion at which the specific electronic component is bonded and fixed can be disposed away from the vibration starting point that is a starting point for the vibration of the specific electronic component, compared to a case where the specific electronic component is bonded and fixed to the circuit board. Consequently, compared to the case where the specific electronic component is bonded and fixed to the circuit board, an effect of suppressing the vibration of the specific electronic component can be increased, making it possible to effectively suppress influence of the vibration of the specific electronic component.

BRIEF DESCRIPTION OF THE DRAWINGS

The foregoing and further features and advantages of the invention will become apparent from the following description of example embodiments with reference to the accompanying drawings, wherein like numerals are used to represent like elements and wherein.

DETAILED DESCRIPTION OF EMBODIMENTS

Figure 1:
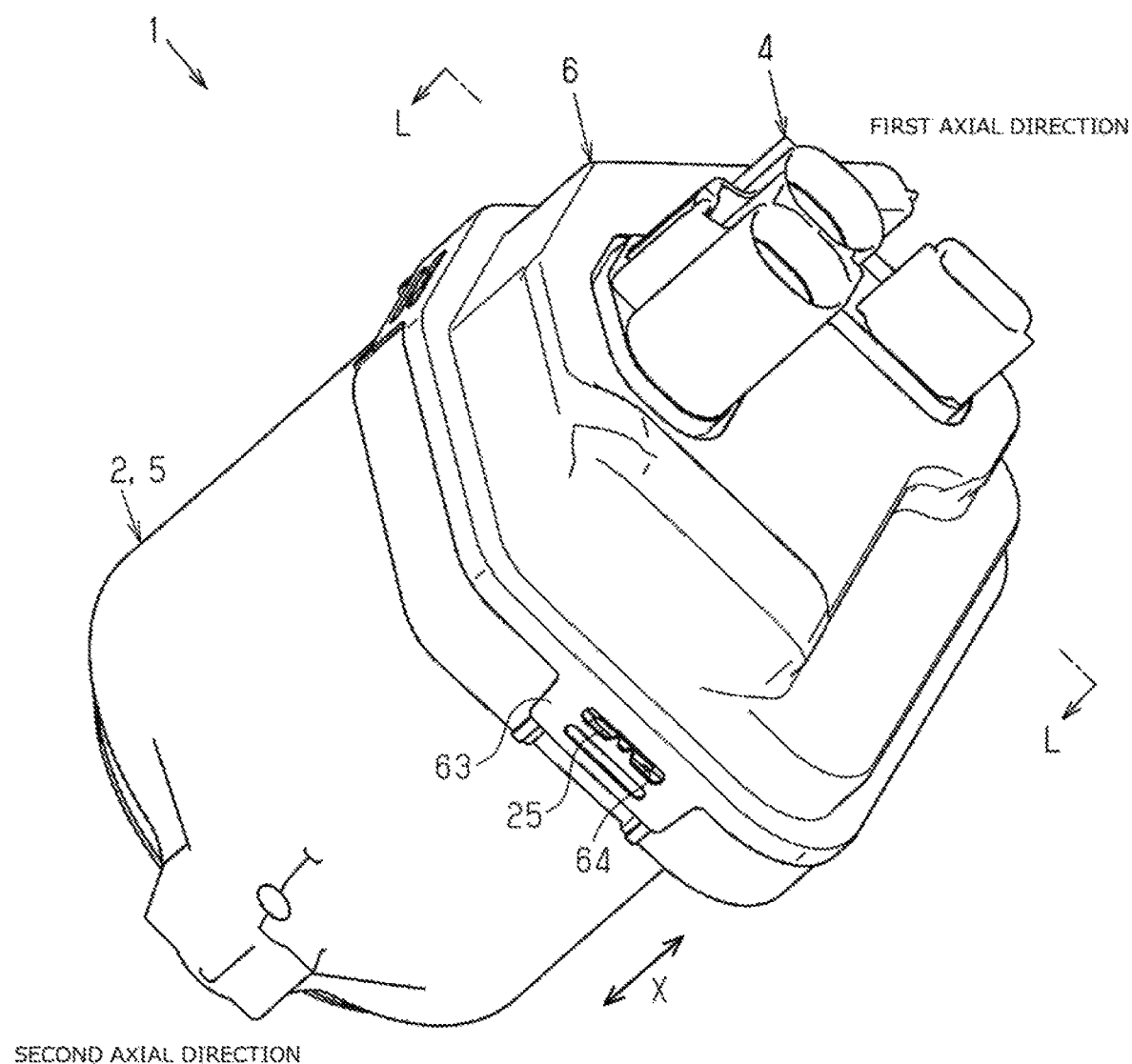
FIG. 1 is a perspective view of a motor device.
Figure 2:
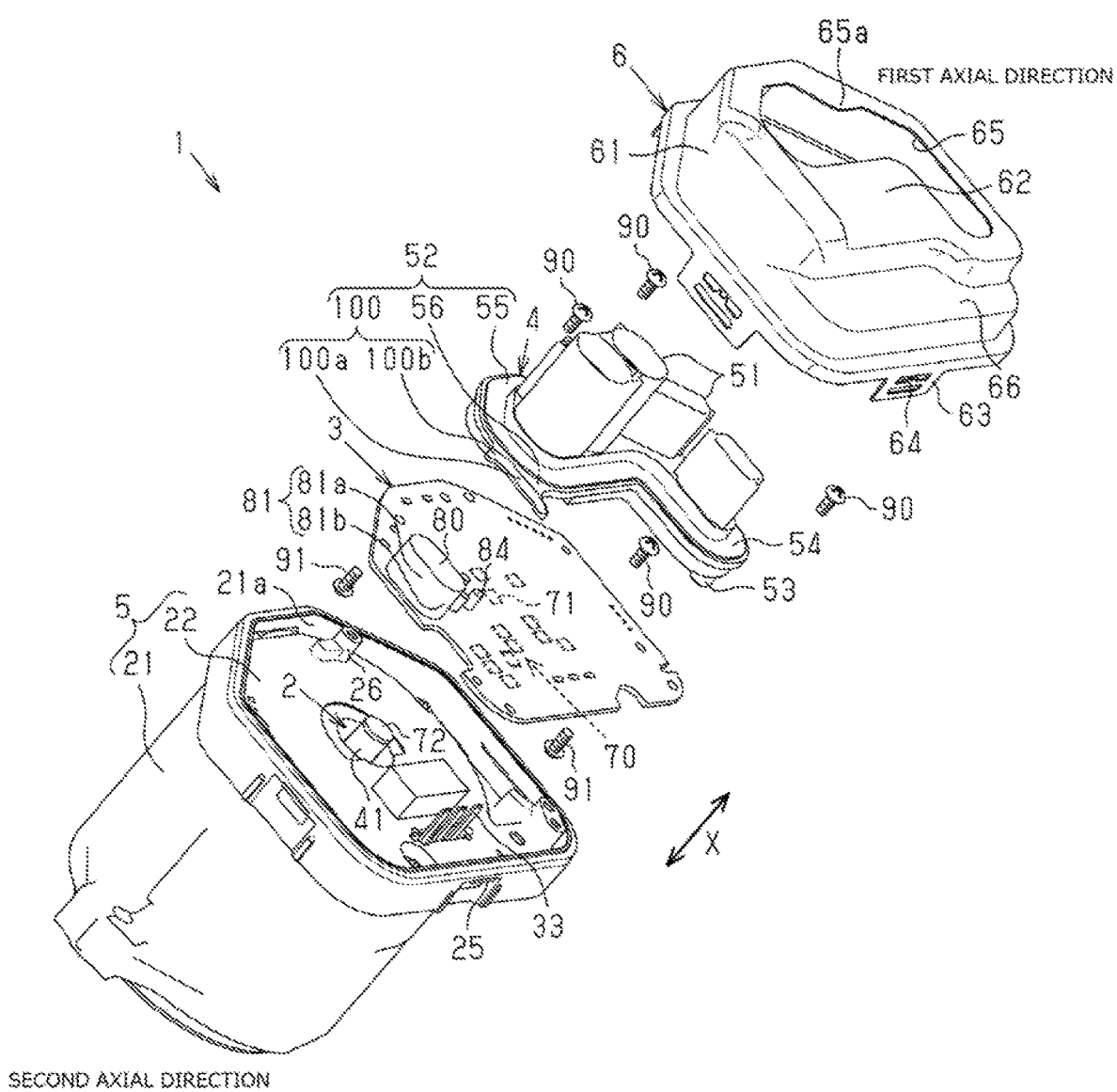
FIG. 2 is an exploded perspective view of the motor device.

Hereinafter, an embodiment of a motor device on which a control device is mounted and that is related to the invention will be described with reference to the drawings. As illustrated in FIGS. 1 and 2, a motor device 1 includes a motor 2, a circuit board 3 composed of circuits that control operation of the motor 2, a connector portion 4 provided on the circuit board 3, a motor housing 5 that accommodates the motor 2, and a cover 6 that covers the circuit board 3 and the connector portion 4. For convenience of description, the cover 6 side will be referred to as a "first axial side", and the motor 2 side as a "second axial side", with reference to an axial direction X of the motor 2. The axial direction X is a direction in which a rotary shaft 41 of the motor 2 extends. The motor device 1 is mounted on an electric power steering system of a vehicle.

Figure 3:
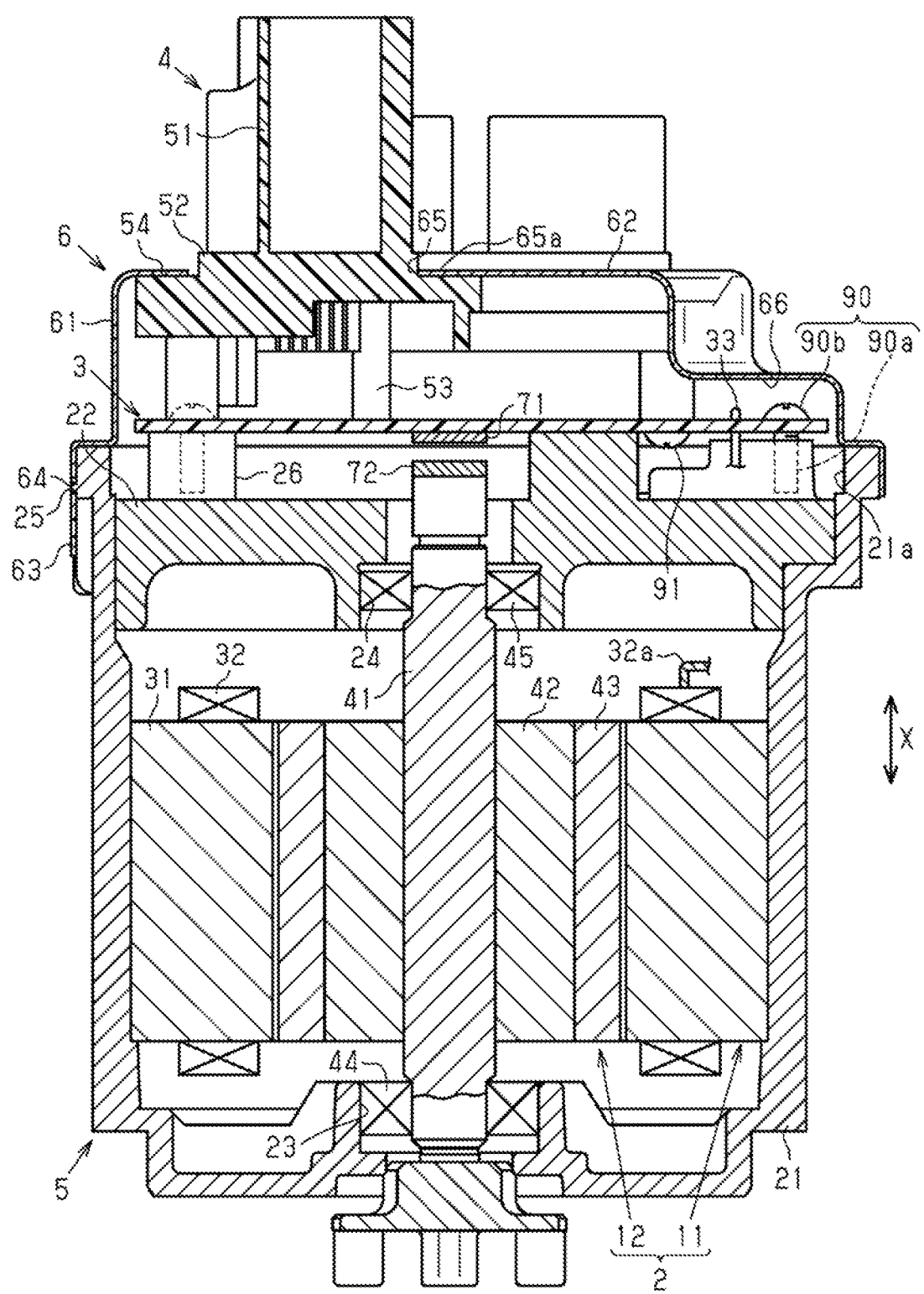
FIG. 3 is a sectional view of the motor device (a sectional view taken along a line L-L in FIG. 1)

A configuration of the motor 2 and the motor housing 5 will be described. As illustrated in FIG. 3, the motor 2 includes a stator 11 fixed to an inside of the motor housing 5, and a rotor 12 disposed on an inner periphery of the stator 11 so as to be rotatable with respect to the stator 11.

As illustrated in FIGS. 2 and 3, the motor housing 5 includes a bottomed tubular housing main body 21 and a flat plate-shaped top plate 22 that closes an opening of the housing main body 21. The top plate 22 functions as a heat sink. A first insertion hole 23 passing through the axial direction X is formed at a center of a bottom portion of the housing main body 21, and a second insertion hole 24 passing through the axial direction X is formed at a center of the top plate 22. An opening end portion 21a of the housing main body 21 has a substantially hexagonal shape in which a substantially rectangular shape is integrated with a substantially trapezoidal shape with one long side of the substantially rectangular shape serving as a bottom side. Two long sides of the substantially rectangular shape are substantially parallel to the two parallel sides of the substantially trapezoidal shape. A plurality of engagement projections 25 is formed on an outer peripheral surface of the opening end portion 21a. A plurality of support portions 26 projecting in a first axial direction (upward in FIG. 3) is formed on the top plate 22.

The stator 11 includes a cylindrical stator core 31 fixed to an inside of a tubular portion of the housing main body 21, and a motor coil 32 wound around the stator core 31. A connection terminal 32a of the motor coil 32 is connected to the circuit board 3 via a bus bar 33.

The rotor 12 includes a cylindrical rotor core 42 fixed to the rotary shaft 41 so as to be rotatable with the rotary shaft 41, and a plurality of permanent magnets 43 fixed to an outer periphery of the rotor core 42. The permanent magnets 43 are disposed such that their magnetic poles (N poles and S poles) are arranged alternately in a circumferential direction of the rotor core 42. A first bearing 44 is provided in the first insertion hole 23 that is formed in the housing main body 21 of the motor housing 5. The first bearing 44 supports an end portion of the rotary shaft 41 on the second axial side with respect to the first insertion hole 23 of the housing main body 21 such that the rotary shaft 41 is rotatable with respect to the first insertion hole 23. A second bearing 45 is provided in the second insertion hole 24 that is formed in the top plate 22 of the motor housing 5. The second bearing 45 supports an end portion of the rotary shaft 41 on the first axial side with respect to the second insertion hole 24 of the top plate 22 such that the rotary shaft 41 is rotatable with respect to the second insertion hole 24. Consequently, the rotary shaft 41 is supported so as to be rotatable with respect to the motor housing 5 via the first bearing 44 and the second bearing 45.

Figure 4:
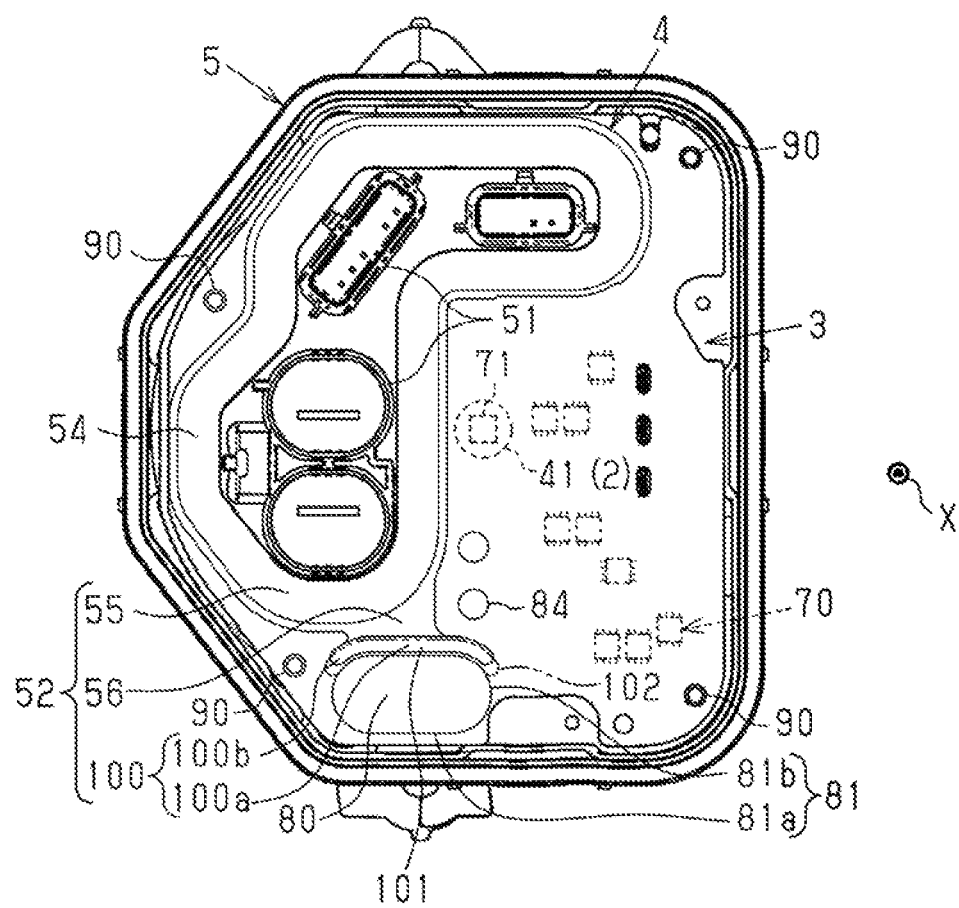
FIG. 4 is a plan view of the motor device from which a cover is removed.

A configuration of the circuit board 3 and the connector portion 4 will be described. As illustrated in FIGS. 2 to 4, the circuit board 3 is formed in a flat, substantially hexagonal shape corresponding to the opening end portion 21a of the housing main body 21. A control circuit, a drive circuit, and various electronic components 70 are mounted on the circuit board 3. The control circuit calculates values such as a target value of a drive current to be supplied to the motor 2. The drive circuit supplies the drive current to the motor 2 in accordance with the target value calculated by the control circuit. The circuit board 3 is a printed circuit board with a wiring pattern exposed on its surface on the connector portion 4 side. A magnetic sensor 71 that detects a rotation angle of the rotary shaft 41 of the motor 2 is mounted on a surface of the circuit board 3 on the opposite side from the connector portion 4. A magnet 72 is attached to an end portion of the rotary shaft 41 that faces the circuit board 3, that is, an end portion of the rotary shaft 41 on the first axial side. The magnetic sensor 71 faces the magnet 72 in the axial direction X of the rotary shaft 41 with a clearance therebetween. The magnetic sensor 71 generates an electrical signal corresponding to a magnetic field that varies in accordance with rotation of the magnet 72. The electrical signal is used to calculate a rotation angle of the rotary shaft 41 of the motor 2. The control device described in claims is composed of the circuit board 3, the connector portion 4, and the electronic components 70.

The circuit board 3 is fixed to the top plate 22 of the motor housing 5 with a plurality of screws 90 being inserted thereto. Each of the screws 90 has a shaft portion 90a and a head portion 90b. Thread grooves are formed on an outer peripheral surface of the shaft portion 90a. The head portion 90b has a hemispherical shape. An outer peripheral surface of the head portion 90b is larger than the shaft portion 90a in diameter. The shaft portion 90a of each of the screws 90 inserted into the circuit board 3 is screwed to the support portion 26 of the top plate 22 of the motor housing 5, so that the circuit board 3 is fixed to the top plate 22.

As illustrated in FIGS. 2 to 4, the connector portion 4 has a base portions 51 extending in a thickness direction of the circuit board 3, and an extended portion 52 extending from the base portions 51 in a direction in which the circuit board 3 extends. The connector portion 4 is provided on the circuit board 3, and exchanges information with an external device. The base portions 51 extend in the first axial direction further than the extended portion 52. A plurality of leg portions 53 extends in a second axial direction from the base portions 51 and the extended portion 52. When viewed in the axial direction X, that is, when viewed in the thickness direction of the circuit board 3, the extended portion 52 is fixed to the circuit board 3 so as to be arranged on the substantially trapezoidal portion side of the circuit board 3 with respect to the rotary shaft 41 of the motor 2. Each of the base portions 51 is formed in a tubular shape, and has an elliptic shape as viewed in the axial direction X. Each of the base portions 51 is formed such that a wiring extending from the external device can be connected thereto.

As illustrated in FIGS. 2 and 3, the connector portion 4 has the leg portions 53. The leg portions 53 are formed in a substantially columnar shape. Distal ends of the leg portions 53 of the connector portion 4 contact the circuit board 3. A plurality of screws 91 passing through the circuit board 3 is screwed to the leg portions 53, so that the connector portion 4 is fixed to the circuit board 3. The screws 91 are inserted into the circuit board 3 from its surface on the opposite side of the circuit board 3 from the connector portion 4. With the connector portion 4 fixed to the circuit board 3, connection terminals extending from terminals (not illustrated) in the base portions 51 are connected to the circuit board 3 at positions set in advance.

As illustrated in FIGS. 2 to 4, an abutting portion 54 that abuts against a bottom wall portion 62 of the cover 6 is provided on a surface of the extended portion 52 on the opposite side from the circuit board 3. When viewed in the axial direction X, the abutting portion 54 formed in an annular shape surrounds the base portions 51. The abutting portion 54 is provided at a peripheral edge of the extended portion 52.

Figure 5:
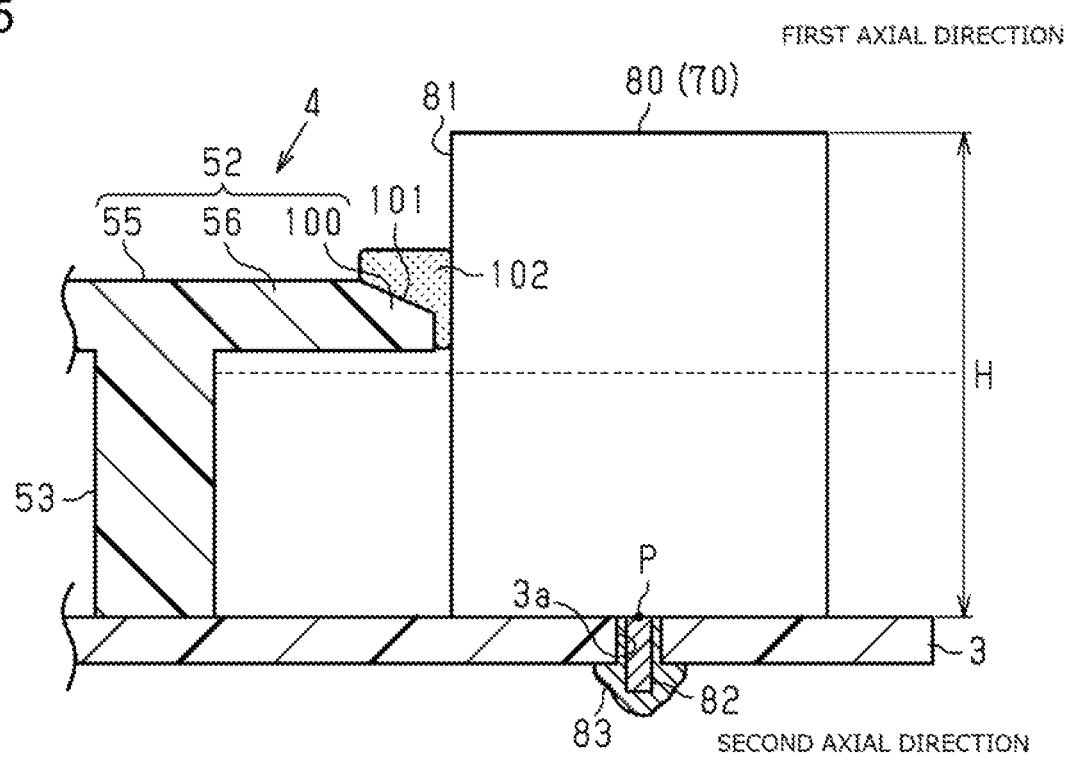
FIG. 5 is an enlarged sectional view of a periphery of a pedestal portion and a coil.

As illustrated in FIGS. 2, 4, and 5, the electronic components 70 have a coil 80 that is a specific electronic component. The coil 80 is an electronic component that reduces electromagnetic noise. The coil 80 is disposed adjacent to the connector portion 4. The coil 80 is disposed on a surface of the circuit board 3 on the connector portion 4 side, and has a coil housing 81 that accommodates a winding having an electrical configuration. A section of the coil housing 81 in the direction in which the circuit board 3 extends has an elliptic shape. A side surface shape of the coil housing 81 in the direction in which the circuit board 3 extends is formed by two first flat portions 81a having a flat shape and two first curved portions 81b having a curved shape. The two first flat portions 81a are disposed parallel to each other. Each of the first curved portions 81b is interposed between an edge of one of the first flat portions 81a and an edge of the other of the first flat portions 81a.

The coil 80 has a terminal 82 extending in the second axial direction from a surface of the coil housing 81 on the circuit board 3 side. The terminal 82 is inserted to a through hole 3a formed in the circuit board 3. The terminal 82 is soldered to a surface of the circuit board 3 on the opposite side from the connector portion 4. A solder 83 is also provided between an inner peripheral surface of the through hole 3a formed in the circuit board 3 and an outer peripheral surface of the terminal 82. Thus, the coil 80 is fixed to the circuit board 3 by the solder 83. The electronic component 70 includes a capacitor 84. The capacitor 84 is disposed on the surface of the circuit board 3 on the connector portion 4 side. A section of the capacitor 84 in the direction in which the circuit board 3 extends has a circular shape. The capacitor 84 is smaller than the coil 80 in size. The capacitor 84 is lower than the coil 80 in height in the thickness direction of the circuit board 3.

When road surface reaction force or the like is applied to the vehicle, the force is transmitted to the motor device 1, which may cause vibration of the electronic components 70 starting from mounting positions of the electronic components 70 on the circuit board 3. The vibration of the electronic components 70 mainly occurs in a direction close to the direction in which the circuit board 3 extends. Since the coil 80 is the highest in height in the thickness direction of the circuit board 3 among the electronic components 70, suppressing vibration of the coil 80 is particularly required among the electronic components 70. Here, a vibration starting point P, which is a starting point of the vibration of the coil 80, is a portion in which the coil 80 is mounted on the circuit board 3, that is, a portion between the coil housing 81 and the terminal 82. The coil 80 vibrates on the circuit board 3 starting from the vibration starting point P. The coil 80 is mounted on a peripheral edge of the circuit board 3. The coil 80 is disposed away from other electronic components by a distance so that it is difficult to bond and fix the coil 80 to the other electronic components mounted on the circuit board 3. One of the reasons that the coil 80 is disposed in this way is as follows. The coil 80 is known as an electronic component from which magnetism is easily leaked. Thus, it is desired to place the coil 80 as far as possible from a magnetic sensor 71 that detects a magnetic field that varies with rotation of the magnet 72. Thus, in the present embodiment, a pedestal portion 100 is provided in the extended portion 52 of the connector portion 4 so as to serve as a portion to which the coil 80 is bonded and fixed.

The extended portion 52 has an annular portion 55, a support portion 56, and the pedestal portion 100. The annular portion 55 surrounds the base portions 51 in the direction in which the circuit board 3 extends. The support portion 56 supports the pedestal portion 100 with respect to the annular portion 55. The pedestal portion 100 serves as the portion to which the coil 80 is bonded and fixed. When viewed in the axial direction X, the pedestal portion 100 has a substantially arcuate shape. That is, when viewed in the axial direction X, the pedestal portion 100 has a shape that extends along a side surface of the coil 80. The pedestal portion 100 has one second flat portion 100a having a flat shape and two second curved portions 100b having a curved shape.

The second flat portion 100a faces the first flat portion 81a in the direction in which the circuit board 3 extends. A clearance is formed between the second flat portion 100a and the first flat portion 81a. The second curved portions 100b are provided so as to face the first curved portions 81b in the direction in which the circuit board 3 extends. Clearances are formed between the second curved portions 100b and the first curved portions 81b. The second flat portion 100a is interposed between an edge of one of the second curved portions 100b and an edge of the other of the second curved portions 100b. The second flat portion 100a and the second curved portions 100b of the pedestal portion 100 are disposed further away from the circuit board 3 than a center of gravity of the coil 80 in the axial direction X. The second flat portion 100a and the second curved portions 100b of the pedestal portion 100 are disposed further away from the circuit board 3 than an intermediate point of the coil 80 in the axial direction X. The intermediate point of the coil 80 in the axial direction X is a position at which a height of the coil 80 in the axial direction X is H/2, that is, a half of a value of a total height H of the coil 80 in the axial direction X.

An inclined face 101 is formed on the pedestal portion 100 on its surface on the opposite side from the circuit board 3. The inclined face 101 is inclined so that a clearance between the inclined face 101 and the coil 80 is reduced from the connector portion 4 toward the coil 80. The inclined face 101 is provided on the second flat portion 100a and the second curved portions 100b. A direction in which the inclined face 101 extends intersects the direction in which the circuit board 3 extends. The inclined face 101 is inclined so that a thickness of the pedestal portion 100 in the axial direction X is reduced from the connector portion 4 toward the coil 80.

An adhesive 102 is applied to the inclined face 101 of the pedestal portion 100. The adhesive 102 is applied to the pedestal portion 100 through injection from an adhesive injection device (not illustrated) disposed on the opposite side of the pedestal portion 100 from the circuit board 3. The adhesive 102 applied to the pedestal portion 100 is guided between the pedestal portion 100 and the coil 80 along the inclination of the inclined face 101 as the inclined face 101 becomes closer to the coil 80. The motor device 1 is mounted on the electric power steering system of the vehicle such that the axial direction X coincides with a vertical direction. When the circuit board 3 is positioned lower than the pedestal portion 100 in the vertical direction, the adhesive 102 applied to the pedestal portion 100 is guided to a clearance between the pedestal portion 100 and the coil 80 along the inclination of the inclined face 101 due to influence of gravity. Consequently, the coil 80 is bonded and fixed to the pedestal portion 100 that serves as the portion to which the coil 80 is bonded and fixed.

The configuration of the cover 6 will be described. As illustrated in FIGS. 2 and 3, the cover 6 has a bottomed polygonal tubular shape corresponding to the opening end portion 21a of the housing main body 21. The cover 6 is made of a metal material. The cover 6 has a tubular side wall portion 61 and a bottom wall portion 62. A plurality of plate-shaped attachment portions 63 projecting in the second axial direction is formed in the side wall portion 61. An engagement hole 64 passing through each of the attachment portions 63 in a thickness direction of the attachment portions 63 is formed in each of the attachment portions 63.

A through hole 65 passing through the bottom wall portion 62 of the cover 6 in the axial direction X is formed in the bottom wall portion 62 of the cover 6. The through hole 65 is formed in a substantially L-shape that is somewhat smaller than the extended portion 52 of the connector portion 4. An inner circumferential edge 65a of the through hole 65 abuts against the abutting portion 54 of the extended portion 52 in the axial direction X. The cover 6 is mounted to the motor housing 5 such that the base portions 51 project from the cover 6 via the through hole 65. The cover 6 is fixed to the motor housing 5 such that the engagement projections 25 engage with the engagement holes 64 of the attachment portions 63.

A step portion 66 is formed in the bottom wall portion 62 of the cover 6, specifically in the substantially rectangular shape portion in the bottom wall portion 62 of the cover 6 having a substantially hexagonal shape as viewed in the axial direction X, such that a distance from the bottom wall portion 62 to the circuit board 3 is reduced.

In the motor device 1 configured as described above, when the drive current is supplied to the motor coil 32 via the circuit board 3, a rotating magnetic field is generated in the stator 11 to rotate the rotor 12.

The procedure for application of the adhesive 102 will be described. The coil 80 is placed on the circuit board 3 with the terminal 82 of the coil 80 inserted to the through hole 3a formed in the circuit board 3. The coil 80 is fixed to the circuit board 3 by soldering the terminal 82 on the surface of the circuit board 3 on the opposite side from the connector portion 4. The electronic components 70 are also fixed to the circuit board 3. The connector portion 4 is fixed to the circuit board 3 with the screws 91 inserted and screwed to the leg portions 53. The circuit board 3 is fixed to the motor housing 5 with the screws 90 inserted and screwed to the top plate 22 of the motor housing 5. In this way, the connector portion 4, the coil 80, and the electronic components 70 are assembled on the circuit board 3. Thus, the pedestal portion 100 provided in the extended portion 52 of the connector portion 4 and the side surface of the coil housing 81 of the coil 80 are disposed so as to face each other with the clearance therebetween.

After the connector portion 4, the coil 80, and the electronic components 70 are assembled on the circuit board 3, the liquid adhesive 102 is applied from the adhesive injection device (not illustrated) to the inclined face 101 of the pedestal portion 100. The liquid adhesive 102 applied to the inclined face 101 is guided to the clearance between the pedestal portion 100 and the side surface of the coil 80 along the inclination of the inclined face 101 as the inclined face 101 becomes closer to the coil 80. When the liquid adhesive 102 is solidified, the coil 80 is bonded and fixed to the pedestal portion 100.

The operation and effects of the present embodiment will be described. (1) The pedestal portion 100 to which the coil 80 is bonded and fixed is provided in the extended portion 52 extending from the base portions 51 in the direction in which the circuit board 3 extends. Thus, the position at which the coil 80 and the pedestal portion 100 are bonded and fixed to each other can be positioned further away from the circuit board 3 than the position at which the coil 80 and the circuit board 3 are bonded and fixed to each other. Hence, the portion at which the coil 80 is bonded and fixed can be disposed away from the vibration starting point that is a starting point for the vibration of the coil 80, compared to a case where the coil 80 is bonded and fixed to the circuit board 3. Consequently, compared to the case where the coil 80 is bonded and fixed to the circuit board 3, an effect of suppressing the vibration of the coil 80 can be increased, making it possible to effectively suppress influence of the vibration of the coil 80. It is also possible to restrain the coil 80 from falling off from the circuit board 3 due to the vibration of the coil 80.

(2) Since the coil 80 is mounted on the circuit board 3, the vibration starts from its mounting position. The vibration mainly occurs in the direction close to the direction in which the circuit board 3 extends. That is, the coil 80 vibrates starting from the vibration starting point P. According to the configuration described above, the pedestal portion 100 and the coil 80 are bonded and fixed to each other in the direction in which the circuit board 3 extends. Thus, it is possible to bond and fix the pedestal portion 100 and the coil 80 to each other to match a vibration mode of the coil 80.

(3) A portion of the coil 80, which is located further away from the circuit board 3 than the center of gravity of the coil 80, is subjected to a larger vibration compared to a portion of the coil 80 that is located closer to the circuit board 3 than the center of gravity of the coil 80. According to the present embodiment, the portion that is located further away from the circuit board 3 than the center of gravity of the coil 80 and that is subjected to the larger vibration is bonded and fixed to the pedestal portion 100. As compared to the case where a portion of the coil 80, which is located closer to the circuit board 3 than the center of gravity of the coil 80 is bonded and fixed to the pedestal portion 100, the influence of the vibration of the coil 80 can be more effectively suppressed.

(4) A portion of the coil 80, which is located further away from the circuit board 3 than the intermediate point of the coil 80 in the thickness direction of the circuit board 3, is subjected to a larger vibration compared to a portion of the coil 80, which is located closer to the circuit board 3 than the intermediate point of the coil 80 in the thickness direction of the circuit board 3. According to the present embodiment, a portion of the coil 80, which is located further away from the circuit board 3 than the intermediate point of the coil 80 in the thickness direction of the circuit board 3, is bonded and fixed to the pedestal portion 100. As compared to a case where a portion of the coil 80, which is located closer to the circuit board 3 than the intermediate point of the coil 80 in the thickness direction of the circuit board 3, is bonded and fixed to the pedestal portion 100, the influence of vibration of the coil 80 can be more effectively suppressed.

(5) When the adhesive 102 is applied to the pedestal portion 100, the adhesive 102 is guided to the clearance between the pedestal portion 100 and the coil 80 along the inclination of the inclined face 101 as the inclined face 101 becomes closer to the coil 80.

(6) When the circuit board 3 is positioned vertically lower than the pedestal portion 100, the adhesive 102 applied to the pedestal portion 100 is guided to the clearance between the pedestal portion 100 and the coil 80 along the inclination of the inclined face 101 due to the influence of gravity.

(7) The coil 80 is an electronic component from which magnetism is easily leaked. Accordingly, the coil 80 is placed on the circuit board 3 at a position as far as possible from the magnetic sensor 71 that is provided on an extended line of the rotary shaft 41 of the motor 2, and thus is likely to be mounted on the peripheral edge of the circuit board 3. In this case, there may be no components that may serve as the portions to which the coil 80 is bonded and fixed among other components mounted on the circuit board 3. Thus, the influence of the vibration of the coil 80 is preferably suppressed by adopting the above configuration and providing the pedestal portion 100, which serves as the portion to which the coil 80 is bonded and fixed, in the connector portion 4 to bond and fix the coil 80 to the pedestal portion 100.

The present embodiment may be modified as described below. The following modified embodiments can be combined with each other as long as they do not technically contradict each other. The mounting position of the coil 80 is not limited to the peripheral edge of the circuit board 3, and the coil 80 may be provided at a position located away from the extended portion 52 of the connector portion 4 by a predetermined distance. In some cases, the coil 80 may be provided on the circuit board 3 on the extended line of the rotary shaft 41.

The inclined face 101 is inclined such that the thickness of the pedestal portion 100 in the axial direction X is reduced from the connector portion 4 toward the coil 80. However, the invention is not limited thereto. For example, the thickness of the pedestal portion 100 in the axial direction X may be constant, and opposite surfaces of the pedestal portion 100 in the axial direction X may be inclined so as to intersect the direction in which the circuit board 3 extends.

The pedestal portion 100 does not need to have an inclined face 101. In this case, for example, the adhesive 102 may be applied so as to fill the clearance between the pedestal portion 100 and the side surface of the coil 80 to bond and fix the pedestal portion 100 and the coil 80 to each other.

The pedestal portion 100 may be disposed closer to the circuit board 3 than the intermediate point of the coil 80 in the axial direction X. Even in this case, as compared to the case where the coil 80 is bonded and fixed to the circuit board 3, the position at which the coil 80 is bonded and fixed can be disposed away from the vibration starting point P. Thus, the effect of suppressing the vibration of the coil 80 can be obtained.

The pedestal portion 100 is disposed further away from the circuit board 3 in the axial direction X than the center of gravity of the coil 80. However, the pedestal portion 100 may be disposed closer to the circuit board 3 than the center of gravity of the coil 80. Even in this case, as compared to the case where the coil 80 is bonded and fixed to the circuit board 3, the position at which the coil 80 is bonded and fixed can be disposed away from the vibration starting point P. Thus, the effect of suppressing the vibration of the coil 80 can be obtained.

In addition to bonding and fixing the coil 80 to the pedestal portion 100, the coil 80 may be bonded and fixed to the circuit board 3 to suppress the vibration of the coil 80.

The pedestal portion 100 is formed of the second flat portion 100a having a flat shape and the second curved portions 100b having a curved shape. However, the pedestal portion 100 may be formed of only the second flat portion 100a, and the pedestal portion 100 may be formed of only the second curved portion 100b. The shape of the pedestal portion 100 only needs to be shaped along the side surface of the specific electronic component. For example, when the side surface of the specific electronic component has a circumferential surface, the pedestal portion 100 is formed of only the second curved portion 100b.

Figure 6:
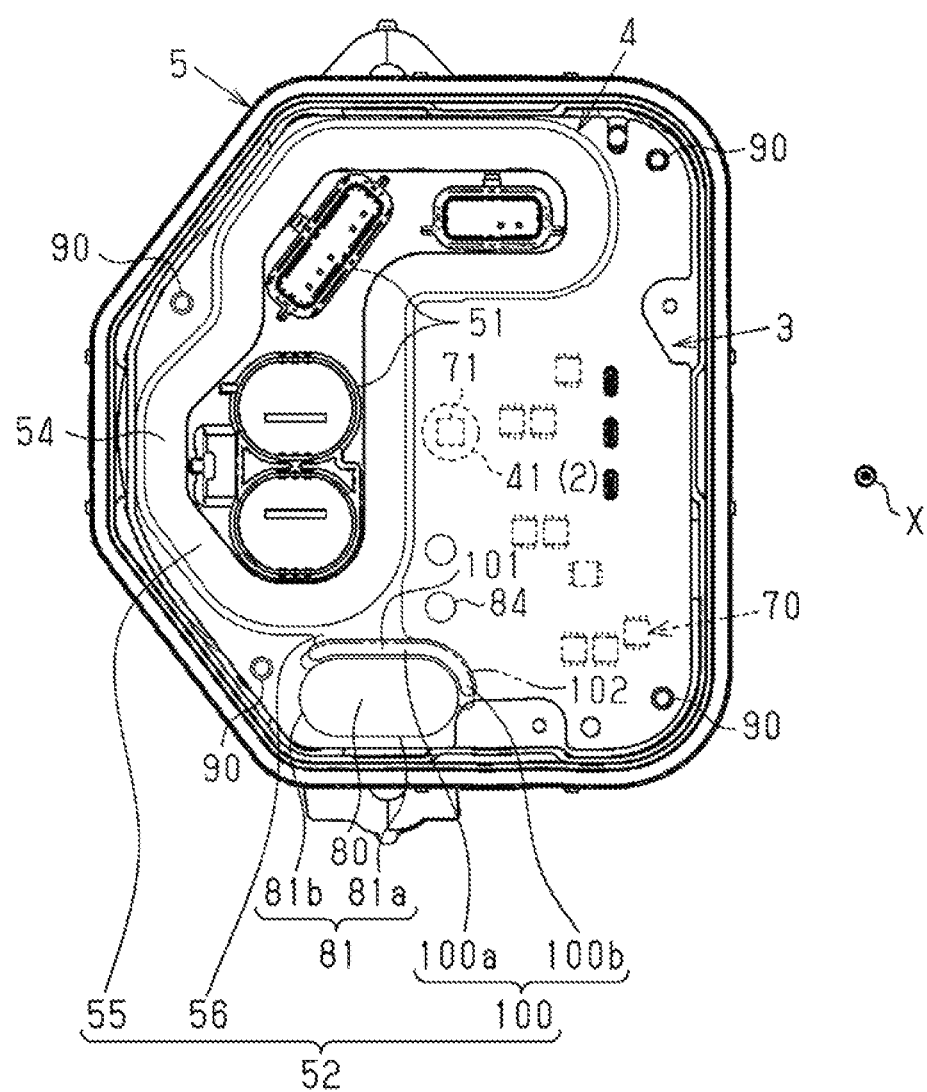
FIG. 6 is a plan view of a motor device from which a cover is removed according to another embodiment.

The shape of the pedestal portion 100 may be determined in consideration of the arrangement of components around the pedestal portion 100, in addition to the shape of the side surface of a component whose vibration is to be suppressed. For example, as illustrated in FIG. 6, one of the two second curved portions 100b illustrated in FIG. 4 may not be provided in consideration of workability of a tool used when the screw 90 is inserted to the circuit board 3.

The pedestal portion 100 has a shape extending along the shape of the side surface of the component whose vibration is to be suppressed. However, as long as the pedestal portion 100 can be bonded and fixed to the side surface of the component whose vibration is to be suppressed, the pedestal portion 100 may have a shape that does not extend along the shape of the side surface of the component whose vibration is to be suppressed.

The pedestal portion 100 may be disposed so as to overlap the coil 80 in the thickness direction of the circuit board 3. In this case, the adhesive 102 may be applied between a surface of the pedestal portion 100 on the circuit board 3 side and a surface of the coil 80 on the opposite side from the circuit board 3 to bond and fix the coil 80 to the pedestal portion 100.

The specific electronic component is not limited to the coil 80, but may be any other electronic component 70 mounted on the circuit board 3, such as the capacitor 84. For example, since the capacitor 84 is an electronic component having a relatively large size among the electronic components 70, the capacitor 84 is preferably bonded and fixed to the pedestal portion 100 to suppress its vibration.

The motor device 1 is mounted on the electric power steering system of the vehicle such that the axial direction X coincides with the vertical direction. However, the invention is not limited thereto. For example, the circuit board 3 may be disposed above the pedestal portion 100 in the vertical direction.

Although the adhesive 102 is used to bond and fix the coil 80 and the pedestal portion 100 to each other, the invention is not limited thereto. For example, instead of the adhesive 102, adhesive tape or the like may be used to bond and fix the coil 80 and the pedestal portion 100 to each other.

Although the circuit board 3 and the cover 6 have a substantially hexagonal shape, the circuit board 3 and the cover 6 may have a substantially square shape, for example. In other words, the shapes of the circuit board 3 and the cover 6 may be changed as needed.

The control device is not limited to a control device that is mounted on the motor device 1, and may be mounted on an electronic apparatus having a connector portion 4. The motor device 1 is not limited to a motor device that is mounted on an electric power steering system of a vehicle, and may be mounted on a drive device that drives a wheel of a vehicle, for example.

What is claimed is:

1. A control device comprising:
a plurality of electronic components;
a circuit board on which the electronic components are mounted; and
a connector portion provided on the circuit board and configured to exchange information with an external device, wherein:
the electronic components include a specific electronic component disposed adjacent to the connector portion, the specific electronic component having at least one side surface that protrudes vertically with respect to a thickness direction of the circuit board;
the connector portion has a base portion extending in the thickness direction of the circuit board and an extended portion extending from the base portion in a direction in which the circuit board extends; and
the extended portion has a pedestal portion (i) positioned at the at least one side surface of the specific electronic component and (ii) bonded and fixed to the specific electronic component.

2. The control device according to claim 1, wherein the pedestal portion and the specific electronic component are bonded and fixed to each other with adhesive in the direction in which the circuit board extends, and at the at least one side surface.

3. The control device according to claim 1, wherein the pedestal portion is disposed further away from the circuit board in the thickness direction of the circuit board than a center of gravity of the specific electronic component.

4. The control device according to claim 1, wherein the pedestal portion is disposed further away from the circuit board in the thickness direction of the circuit board than an intermediate point of the specific electronic component in the thickness direction of the circuit board.

5. The control device according to claim 1, wherein the pedestal portion has an inclined face such that a thickness of the pedestal portion decreases toward a distal end of the pedestal portion.

6. A motor device comprising:
the control device according to claim 1;
a motor;
a motor housing that accommodates the motor; and
a cover that covers the circuit board and the connector portion, wherein:
the thickness direction of the circuit board coincides with an axial direction of the motor;
a magnetic sensor for detecting a rotation angle of a rotary shaft of the motor is mounted on the circuit board on an extended line of the rotary shaft; and
the specific electronic component is a coil that is mounted on a peripheral edge of the circuit board.

7. The control device according to claim 1, wherein the pedestal portion is arcuate-shaped.

8. A control device comprising:
a plurality of electronic components;
a circuit board on which the electronic components are mounted; and
a connector portion provided on the circuit board and configured to exchange information with an external device, wherein:
the electronic components include a specific electronic component disposed adjacent to the connector portion, the specific electronic component having at least one side surface that protrudes vertically with respect to a thickness direction of the circuit board;
the connector portion has a base portion extending in the thickness direction of the circuit board and an extended portion extending from the base portion in a direction in which the circuit board extends;
the extended portion has a pedestal portion (i) positioned at the at least one side surface of the specific electronic component and (ii) bonded and fixed to the specific electronic component; and
wherein the pedestal portion suppresses vibration of the specific electronic component.

* * * * *